US012635560B2

(12) United States Patent
Kogawa

(10) Patent No.: US 12,635,560 B2
(45) Date of Patent: May 19, 2026

(54) SEMICONDUCTOR APPARATUS

(71) Applicant: FUJI ELECTRIC CO., LTD.,
Kawasaki (JP)

(72) Inventor: Hiroki Kogawa, Matsumoto (JP)

(73) Assignee: FUJI ELECTRIC CO., LTD.,
Kawasaki (JP)

( * ) Notice: Subject to any disclaimer, the term of this
patent is extended or adjusted under 35
U.S.C. 154(b) by 607 days.

(21) Appl. No.: 17/826,939

(22) Filed: May 27, 2022

(65) Prior Publication Data

US 2022/0406669 A1 Dec. 22, 2022

(30) Foreign Application Priority Data

Jun. 22, 2021 (JP) ................................. 2021-103456

(51) Int. Cl.
| | |
|---|---|
| *H01L 23/057* | (2006.01) |
| *H01L 21/48* | (2006.01) |
| *H01L 23/00* | (2006.01) |
| *H01L 23/373* | (2006.01) |
| *H01L 25/16* | (2023.01) |

(52) U.S. Cl.
CPC ........ *H01L 23/057* (2013.01); *H01L 21/4817*
(2013.01); *H01L 23/3735* (2013.01); *H01L
24/32* (2013.01); *H01L 24/48* (2013.01);
*H01L 24/73* (2013.01); *H01L 25/162*
(2013.01); *H01L 2224/32225* (2013.01); *H01L
2224/48137* (2013.01); *H01L 2224/48175*
(2013.01); *H01L 2224/73265* (2013.01)

(58) Field of Classification Search
CPC ... H01L 23/057; H01L 23/3735; H01L 23/04;
H01L 23/24; H01L 23/36; H01L
23/49861; H01L 23/13; H01L 23/3121;
H01L 23/49548; H01L 23/49565; H01L
21/4817; H01L 24/32; H01L 24/48; H01L
24/73; H01L 24/85; H01L 2224/48175;
H01L 2224/73265; H01L 2224/32245;
H01L 2924/181
See application file for complete search history.

(56) References Cited

U.S. PATENT DOCUMENTS

| | | | |
|---|---|---|---|
| 8,115,294 B2 * | 2/2012 | Otremba | ........... H01L 23/49575 |
| | | | 257/690 |
| 9,837,338 B2 * | 12/2017 | Sato | .................. H01L 23/49541 |
| 11,462,504 B2 * | 10/2022 | Tokubo | ............. H01L 23/49562 |

(Continued)

FOREIGN PATENT DOCUMENTS

| | | |
|---|---|---|
| JP | 2005-209067 A | 8/2005 |
| JP | 2009-267071 A | 11/2009 |

(Continued)

*Primary Examiner* — Dao H Nguyen

(57) ABSTRACT

A semiconductor apparatus includes: a first semiconductor
chip; a resin enclosure having a space in which the first
semiconductor chip is positioned; a lead terminal disposed
in the resin enclosure; a second semiconductor chip config-
ured to: control the first semiconductor chip, and be disposed
on a first portion of the resin enclosure, the resin enclosure
not overlapping with the lead terminal, as seen in planar
view from a direction perpendicular to a top surface of the
lead terminal; and a wire having a first end connected to the
lead terminal and a second end connected to the second
semiconductor chip.

9 Claims, 12 Drawing Sheets

(56)        References Cited

U.S. PATENT DOCUMENTS

| | | | | |
|---|---|---|---|---|
| 11,652,030 | B2 * | 5/2023 | Baek ................... | H01L 23/3735 |
| | | | | 257/666 |
| 2013/0011970 | A1 * | 1/2013 | Honda ................ | H01L 23/3107 |
| | | | | 438/118 |
| 2013/0082334 | A1 * | 4/2013 | Nakamura ............. | H01L 24/40 |
| | | | | 257/E27.06 |
| 2014/0374889 | A1 * | 12/2014 | Denta .................... | H01L 25/18 |
| | | | | 257/666 |
| 2016/0307854 | A1 * | 10/2016 | Matsubara ............. | H01L 24/45 |
| 2017/0221800 | A1 * | 8/2017 | Nishikizawa ........... | H01L 24/83 |
| 2021/0125904 | A1 * | 4/2021 | Sugimachi ......... | H01L 23/4334 |
| 2022/0208654 | A1 * | 6/2022 | Baek ....................... | H01L 24/48 |

FOREIGN PATENT DOCUMENTS

| | | | |
|---|---|---|---|
| JP | 2013-239479 | A | 11/2013 |
| JP | 2014-007189 | A | 1/2014 |

* cited by examiner

PLAN VIEW OF AREA AR1

A1-A2 EXPLODED CROSS-SECTION

PLAN VIEW OF AREA AR2

C1-C2 EXPLODED
CROSS-SECTION

SEMICONDUCTOR APPARATUS

CROSS REFERENCE TO RELATED APPLICATION

This application is based on and claims priority from Japanese Patent Application No. 2021-103456 filed on Jun. 22, 2021, the entire contents of which are incorporated herein by reference.

BACKGROUND OF THE INVENTION

Field of the Invention

The present disclosure relates to semiconductor apparatuses.

Description of Related Art

A semiconductor apparatus is known in which a power semiconductor chip including a power semiconductor element, such as an insulated gate bipolar transistor (IGBT), is housed in a resin enclosure. Such a semiconductor apparatus further includes a control chip, such as a control integrated circuit (IC) for controlling the power semiconductor chip, and lead terminals extending from an inside to an outside of the resin enclosure. Patent Document 1 (Japanese Patent Application Laid-Open Publication No. 2013-239479) discloses a semiconductor apparatus in which a control chip is disposed on a lead terminal with an insulation layer in between.

SUMMARY

It is desired for the semiconductor apparatus as described above to provide insulation at a rear surface of the control chip.

A semiconductor apparatus according to one aspect of the present disclosure includes a first semiconductor chip; a resin enclosure having a space in which the first semiconductor chip is positioned; a lead terminal disposed in the resin enclosure; a second semiconductor chip configured to: control the first semiconductor chip, and be disposed on a first portion of the resin enclosure, the resin enclosure not overlapping with the lead terminal, as seen in planar view from a direction perpendicular to a top surface of the lead terminal; and a wire having a first end connected to the lead terminal and a second end connected to the second semiconductor chip.

A semiconductor apparatus according to another aspect of the present disclosure includes: a first semiconductor chip; a resin enclosure having a space in which the first semiconductor chip is positioned; a lead terminal disposed in the resin enclosure; a second semiconductor chip configured to control the first semiconductor chip; and a wire having a first end connected to the lead terminal and a second end connected to the second semiconductor chip, in which the lead terminal includes a second top surface recessed from a first top surface to which the wire is connected, in which the resin enclosure includes a first portion provided on the second top surface of the lead terminal, and in which the second semiconductor chip is disposed in the first portion of the resin enclosure, not to contact with the lead terminal.

The semiconductor apparatus according to the present disclosure can secure insulation of the rear surface of the control chip.

DESCRIPTION OF THE EMBODIMENTS

Figure 1:
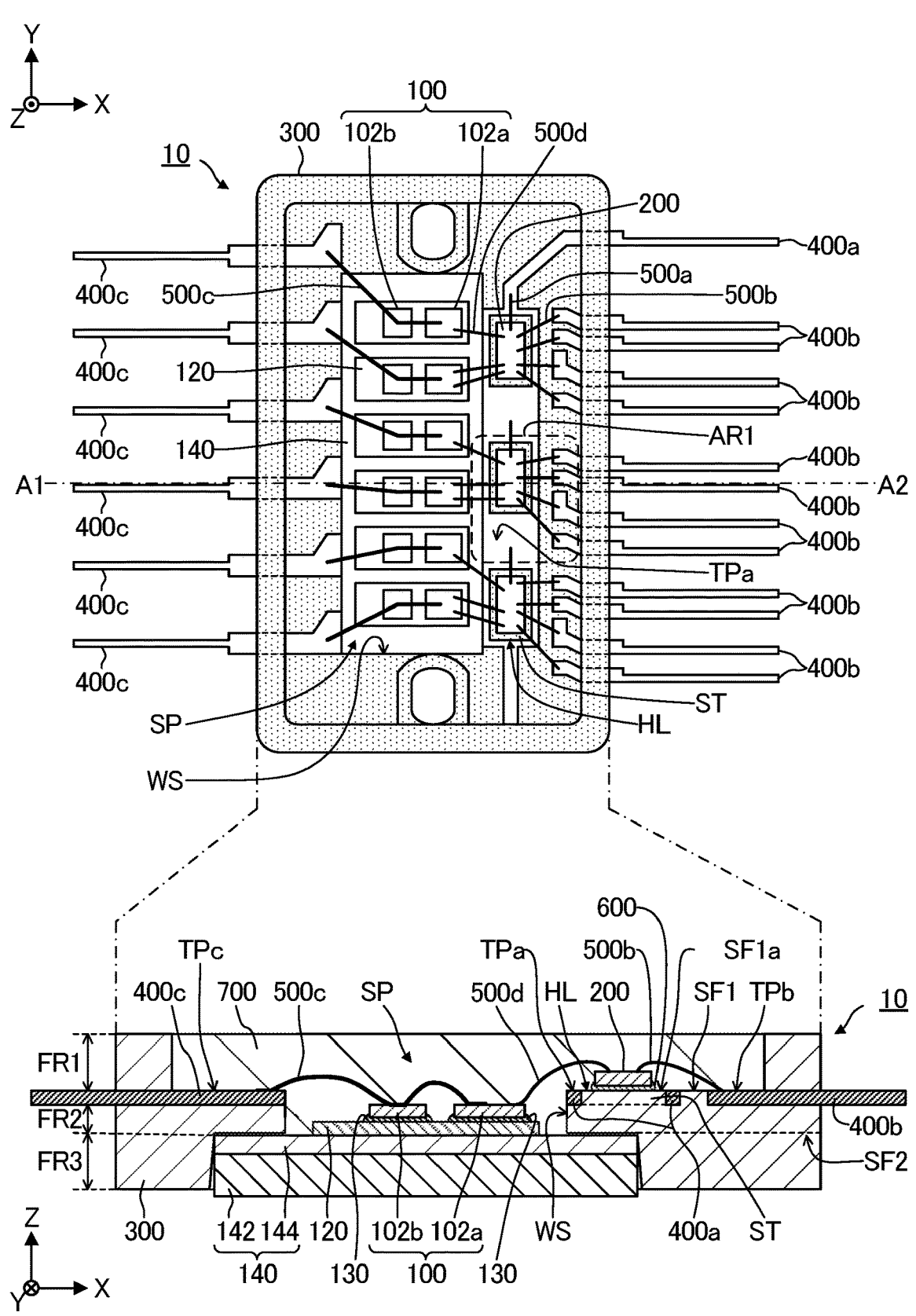
FIG. 1 is a schematic diagram of a semiconductor apparatus according to a first embodiment.

Some embodiments of the present disclosure are described below with reference to drawings. In the drawings, dimensions and scales of portions are appropriately different from actual dimensions and scales of the portions.

The embodiments described below are preferred specific examples of the present disclosure. Therefore, various preferred technical limitations are applied to the embodiments. However, the scope of the present disclosure is not limited to these embodiments unless specific description limiting the present disclosure is given in the following description.

A. EMBODIMENTS

Some embodiments of the present disclosure are described below.

First, an example of overview of a semiconductor apparatus 10 according to a first embodiment will be described with reference to FIG. 1.

A1: First Embodiment

FIG. 1 is a schematic diagram of the semiconductor apparatus 10 according to the first embodiment.

In the following, a three-axis orthogonal coordinate system including an X axis, a Y axis, and a Z axis that are orthogonal to one another is adopted for convenience of description.

In the following, a direction indicated by an arrow of the X axis is referred to as a +X direction, and a direction opposite to the +X direction is referred to as a −X direction. A direction indicated by an arrow of the Y axis is referred to as a +Y direction, and a direction opposite to the +Y direction is referred to as a −Y direction. A direction indicated by an arrow of the Z axis is referred to as a +Z direction, and a direction opposite to the +Z direction is referred to as a –Z direction.

In the following, the +Y direction and the –Y direction are each referred to as the Y direction without particular distinguishing in some cases. The +X direction and the –X direction are each referred to as the X direction without particular distinguishing in some cases. The +Z direction and the –Z direction are each referred to as the Z direction without particular distinguishing in some cases. In the following, the +Z direction is referred to as an upper side, and the –Z direction is referred to as a lower side in some cases.

In the following, viewing of an object from a specific direction is referred to as "planar view" in some cases. FIG. 1 shows a plan view of the semiconductor apparatus 10 when viewed from the +Z direction, and a cross-sectional view of the semiconductor apparatus 10 taken along line A1-A2. In the following, the planar view from the +Z direction is simply referred to as "planar view" in some cases. The planar view from the +Z direction corresponds to planar view from a direction perpendicular to a top surface TPa of a lead terminal 400a.

The semiconductor apparatus 10 is a power semiconductor apparatus including a power semiconductor element, such as a switching element. Examples of the switching element include a power metal oxide semiconductor field effect transistor (MOSFET) and an insulated gate bipolar transistor (IGBT). Examples of the power semiconductor apparatus include an inverter device, which includes a switching element and a control circuit controlling the switching element. In this embodiment, the semiconductor apparatus 10 may be an intelligent power module (IPM) in which the switching element, and the control circuit are housed in one package.

For example, the semiconductor apparatus 10 includes chip pairs 100, control chips 200, a resin enclosure 300, and lead terminals 400 (400a, 400b, and 400c). The semiconductor apparatus 10 further includes circuit layers 120, connection portions 130, an insulated metal substrate 140, wires 500 (500a, 500b, 500c, and 500d), a sealing resin 700, and other elements. Each of the chip pairs 100 is a set of a power semiconductor chip 102a and a power semiconductor chip 102b. In the following, the power semiconductor chips 102a and 102b are collectively referred to as power semiconductor chips 102 in some cases. In the plan view of FIG. 1, the resin enclosure 300 is shown by hatching.

Each of the power semiconductor chips 102a is an example of "first semiconductor chip". For example, each of the power semiconductor chips 102a is a power MOSFET, an IGBT. For example, each of the power semiconductor chips 102b is a diode, such as a free wheeling diode (FWD) that is connected antiparallel to the corresponding power semiconductor chip 102a. The diode being connected antiparallel to the switching element means that the diode is connected in parallel with the switching element such that a forward direction of the diode is opposite to a forward direction of the switching element. A set of the switching element and the diode may be formed in one semiconductor chip as a so-called reverse conducting IGBT (RC-IGBT).

In the example shown in FIG. 1, the chip pairs 100 are arranged at intervals in the Y direction, and are connected to the respective lead terminals 400c through the wires 500c. The power semiconductor chips 102a and 102b are arranged, for example, with an interval in the X direction on each of the circuit layers 120. The circuit layers 120 are layers each provided with a wiring pattern and other patterns. For example, as shown in the cross-sectional view of FIG. 1, the chip pairs 100 are connected to the respective circuit layers 120 by the connection portions 130. Each of the connection portions 130 may be a conductive brazing material containing a metal material such as silver, or a soldering material. The circuit layers 120 are disposed on the insulated metal substrate 140 (more specifically, on insulation layer 144 described below). The insulated metal substrate 140 includes a metal substrate 142 made of a metal material, and the insulation layer 144 made of an insulation material on the metal substrate 142. For example, the insulation layer 144 is a ceramic substrate, and the metal substrate 142 acts as a heat dissipation plate dissipating heat generated from the chip pairs 100.

Each of the control chips 200 is an example of "second semiconductor chip". The control chips 200 control the power semiconductor chips 102a and 102b. For example, each of the control chips 200 is a semiconductor chip including an integrated circuit that controls conduction/non-conduction of the power semiconductor chips 102a and 102b. In this embodiment, each of the control chips 200 may be a high voltage integrated circuit (HVIC). For example, in a case in which a circuit in which two switching elements are connected in series between two wires is assumed, the HVIC is an integrated circuit driving a gate of the switching element connected to the wire having a higher voltage out of the two wires. An integrated circuit driving a gate of the switching element connected to the wire having a lower voltage out of the two wires is referred to as a low voltage integrated circuit (LVIC).

The lead terminals 400 are each made of, for example, a metal material. For example, the lead terminals 400 are formed integrally with the resin enclosure 300 by insert molding. As a result, the lead terminals 400 are arranged in the resin enclosure 300. For example, each of the lead terminals 400 includes, as seen in planar view, an end positioned on the resin enclosure 300 and an end positioned outside the resin enclosure 300. In other words, each of the lead terminals 400 extends from the inside to the outside of the resin enclosure 300.

Each of the lead terminals 400b extends, for example, in the X direction. The lead terminals 400b are arranged in the Y direction at an edge of the resin enclosure 300 in the +X direction. Each of the lead terminals 400c extends, for example, in the X direction. Furthermore, the lead terminals 400c are arranged in the Y direction at an edge of the resin enclosure 300 in the –X direction. For example, the chip pairs 100 are arranged between the lead terminals 400b and the lead terminals 400c. The lead terminal 400a is provided so as to pass through the edge of the resin enclosure 300 in the +X direction from an area between the chip pairs 100 and the lead terminals 400b. In other words, the lead terminal 400a includes a portion extending in an arrangement direction (Y direction) of the chip pairs 100 on the resin enclosure 300.

For example, openings HL are provided with intervals in the Y direction in the portion of the lead terminal 400a extending in the Y direction. For example, the openings HL are provided for each of the control chips 200. The lead terminal 400a is an example of "lead terminal", and each of the openings HL is an example of "openings".

The resin enclosure 300 is made of, for example, a thermoplastic resin. Examples of the thermoplastic resin include a polyphenylene sulfide (PPS) resin, a polybutylene terephthalate (PBT) resin, a polybutylene succinate (PBS) resin, a polyamide (PA) resin, and an acrylonitrile-butadiene-styrene (ABS) resin.

For example, the resin enclosure 300 includes pedestal portions ST positioned inside the respective openings HL in the lead terminal 400a. For example, the pedestal portions ST of the resin enclosure 300 are provided inside the respective openings HL such that the openings HL are filled, as shown in the cross-sectional view of FIG. 1. The control chips 200 are bonded to surfaces SF1a of the pedestal portions ST with an insulating adhesive 600. The resin enclosure 300 is an example of a "resin enclosure", and each of the pedestal portions ST is an example of a "first portion".

In this embodiment, the openings HL are provided for the respective control chips 200, and therefore the pedestal portions ST are provided for the respective control chips 200. The control chips 200 are disposed on the respective pedestal portions ST so as not to make contact with the lead terminal 400a. In other words, the control chips 200 are disposed on the respective pedestal portions ST of the resin enclosure 300 not overlapping with the lead terminal 400a, as seen in planar view.

When the control chips 200 being disposed on the pedestal portions ST, the control chips 200 are connected to the lead terminal 400a by the wires 500a, then the control chips 200 are connected to the lead terminals 400b by the wires 500b, and then the control chips 200 are connected to the power semiconductor chips 102d by the wires 500d. As a result, the control chips 200 are electrically connected to the lead terminal 400a and the other terminals. For example, the lead terminal 400a has a supply of a voltage, such as a common ground voltage applied to the control chips 200. The wires 500 are each made of a metal material. Each of the wires 500a is an example of a "wire".

As described above, in this embodiment, there is no provision of the lead terminal 400a below the control chips 200 because the control chips 200 are disposed on the pedestal portions ST of the resin enclosure 300, which is positioned inside the openings HL in the lead terminal 400a. Therefore, in this embodiment, it is possible to provide insulation between the control chips 200 and the lead terminal 400a.

In this embodiment, the control chips 200 are positioned inside the openings HL of the lead terminal 400a, as seen in planar view. Accordingly, it is possible to prevent distances between the control chips 200 and each of the parts therearound (the power semiconductor chips 102a and the lead terminals 400a and 400b) from being increased. As a result, in this embodiment, it is possible to prevent the wires 500a, 500b, 500d, and other wires connected to the control chips 200 from being increased in length.

For example, the resin enclosure 300 is rectangular, and it surrounds the chip pairs 100, as seen in planar view. For example, as shown in the cross-sectional view of FIG. 1, the resin enclosure 300 includes a first frame portion FR1, a second frame portion FR2, and a third frame portion FR3. The second frame portion FR2 is rectangular, and it has an opening. The first frame portion FR1 is rectangular, and it protrudes in the +Z direction from a peripheral edge on a first surface SF1 of the second frame portion FR2. The third frame portion FR3 is rectangular, and it protrudes in the −Z direction from a peripheral edge on a second surface SF2 of the second frame portion FR2.

The lead terminals 400a, 400b, and 400c are arranged between the first frame portion FR1 and the second frame portion FR2. For example, the first surface SF1 of the second frame portion FR2, top surfaces TPb of the lead terminals 400b, and top surfaces TPc of the lead terminals 400c are positioned in the same plane. The top surface TPa of the lead terminal 400a may be present in the same plane as the first surface SF1 of the second frame portion FR2. The surfaces positioned in the same plane means that the surfaces are parallel to one another and the surfaces are present at the same position in a direction perpendicular to the surfaces. Here, the term "parallel" includes not only strictly parallel but also substantial parallel (for example, parallel within an error range). The term "same" includes not only strict same but also substantial same (for example, difference between positions of surfaces is within error range).

The chip pairs 100 are positioned in a space SP inside the opening of the second frame portion FR2. The space SP is defined by an inner wall surface WS of the second frame portion FR2. An upper end of the inner wall surface WS intersects the first surface SF1 of the second frame portion FR2. The control chips 200 are arranged on the first surface SF1 (more specifically, portion surrounded by first frame portion FR1) of the second frame portion FR2. The lead terminals 400 are arranged on the first surface SF1. The lead terminals 400 may be embedded in the first surface SF1, and it may be a part of the first surface SF1. The second frame portion FR2 includes the pedestal portions ST inside the openings HL in the lead terminal 400a. For example, the pedestal portions ST are provided such that the surfaces SF1a of the pedestal portions ST are continuous with the top surface TPa of the lead terminal 400a with no step. As a result, the surfaces SF1a of the pedestal portions ST and the top surface TPa of the lead terminal 400a are positioned in the same plane. Since the pedestal portions ST are parts of the second frame portion FR2, the surfaces SF1a of the pedestal portions ST are parts of the first surface SF1 of the second frame portion FR2.

The insulated metal substrate 140 is connected to the second surface SF2 (more specifically, portion surrounded by third frame portion FR3) of the second frame portion FR2 by a connection portion, not shown. As a result, the insulated metal substrate 140 is disposed in a space inside an opening of the third frame portion FR3. As described above, the resin enclosure 300 is joined to the insulated metal substrate 140 such that the chip pairs 100 (power semiconductor chips 102a and 102b) are positioned inside the space SP. In the following, the connection portion connecting the insulated metal substrate 140 to the resin enclosure 300 (more specifically, second surface SF2 of second frame portion FR2) is referred to as a substrate joining portion.

When the insulated metal substrate 140 is joined to the resin enclosure 300, for example, an opening on a lower side of the resin enclosure 300 is closed, and a material of the sealing resin 700 can be injected into the space inside the resin enclosure 300 from an opening on the upper side. The material of the sealing resin 700 is a thermosetting resin, such as an epoxy resin. The space inside the resin enclosure 300 is surrounded by, for example, the first frame portion FR1 and the second frame portion FR2. When the space inside the resin enclosure 300 is filled with the sealing resin 700 from the opening on the upper side of the resin enclosure 300, the circuit layers 120, the chip pairs 100 (power semiconductor chips 102a and 102b), the control chips 200, the wires 500, and other elements are sealed by the sealing resin 700. However, the shape of the resin enclosure 300 is not limited thereto. For example, the third frame portion FR3 may not be frame shaped, and it may have a bottom surface that closes the opening of the second frame portion FR2.

Next, the openings HL of the lead terminal 400a and the pedestal portions ST of the resin enclosure 300 are described with reference to FIG. 2.

Figure 2:
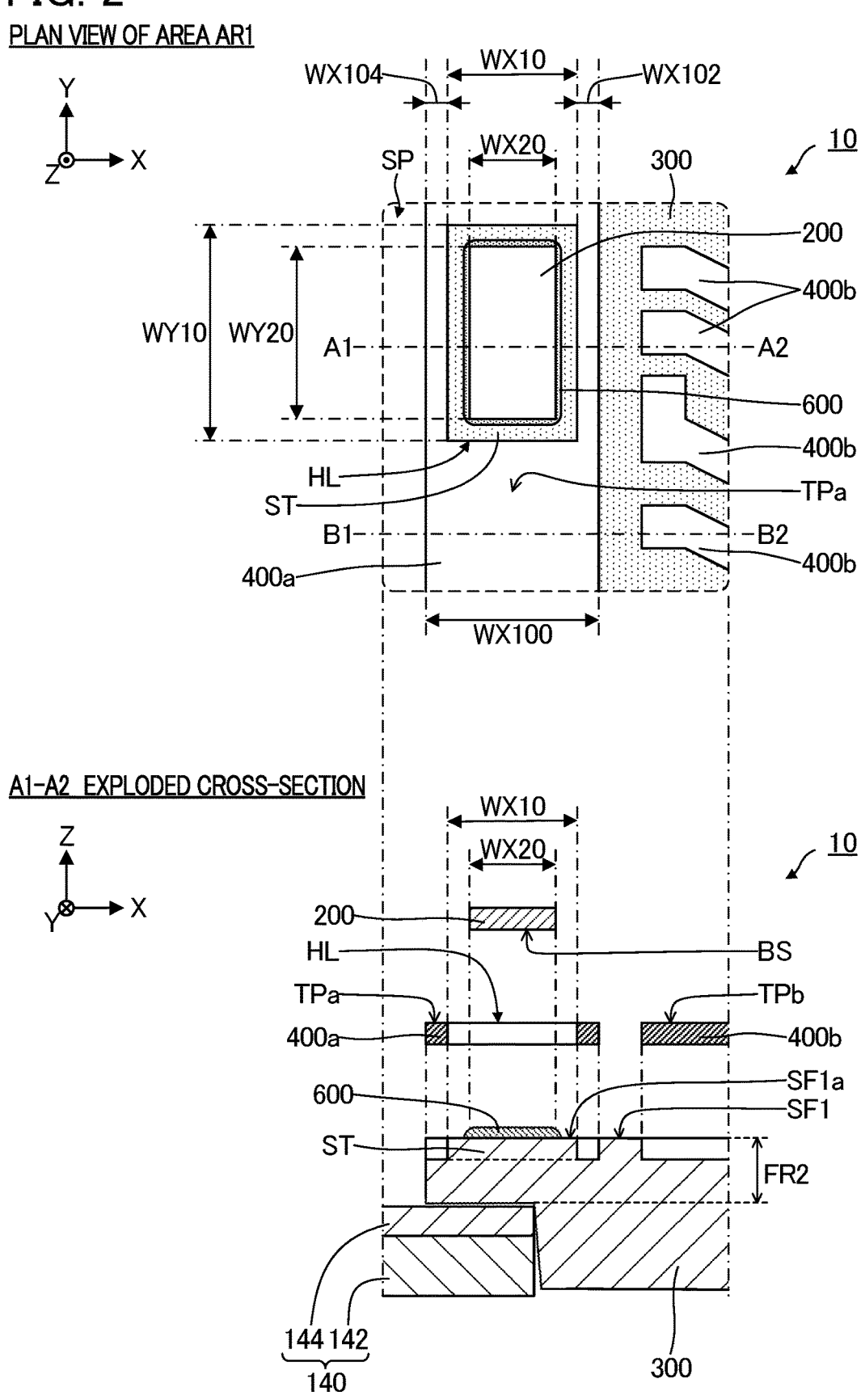
FIG. 2 shows an opening and a pedestal portion shown in FIG. 1.

FIG. 2 is an explanatory diagram of one of the openings HL and the corresponding pedestal portion ST shown in FIG. 1. A plan view of FIG. 2 is a plan view of an area AR1 enclosed by a dashed line shown in the plan view of FIG. 1. An A1-A2 exploded cross-sectional view schematically illustrates an exploded cross-section of the semiconductor apparatus 10 taken along line A1-A2 in the plan view of the area AR1. In FIG. 2, the wires 500 and other elements are omitted for clarity.

In this embodiment, as shown in the A1-A2 exploded cross-sectional view, the lead terminal 400a has the openings HL in the lead terminal 400a. In this embodiment, the lead terminal 400a is formed integrally with the resin enclosure 300 by insert molding. Therefore, parts of the resin enclosure 300 are formed, and these are the pedestal portions ST inside the respective openings HL of the lead terminal 400a.

The surfaces SF1a of the pedestal portions ST in the first surface SF1 of the second frame portion FR2 are bonded to the rear surfaces BS of the control chips 200 with the adhesive 600. The control chips 200 are arranged so as not to contact with the lead terminal 400a. For example, as shown in the plan view of the area AR1, the openings HL of the lead terminal 400a are each rectangular space, as seen in planar view. Furthermore, the control chips 200 do not overlap with the lead terminal 400a, as seen in planar view. Specifically, the control chips 200 are arranged such that outer peripheral edges of the control chips 200 are positioned inside inner peripheral edges of the openings HL, as seen in planar view. Each of the control chips 200 is disposed such that a predetermined distance is secured over an entire circumference between the outer peripheral edge of the control chip 200 and the inner peripheral edge of the corresponding opening HL, as seen in planar view. Therefore, each of the openings HL of the lead terminal 400a is formed such that, for example, a width WX10 in the X direction is greater than a width WX20 of each of the control chips 200 in the X direction, and a width WY10 in the Y direction is greater than a width WY20 of each of the control chips 200 in the Y direction. A width WX102 and a width WX104 in the X direction of a portion of the lead terminal 400a where each opening HL is provided may be equal to each other or different from each other.

In this embodiment, since the entirety of the control chips 200 are positioned inside the respective openings HL in the lead terminal 400a, as seen in planar view, the control chips 200 are surrounded by the lead terminal 400a. Therefore, in this embodiment, a distance between each of the control chips 200 and the lead terminal 400a can be made smaller over the entire circumference of the edge of each of the control chips 200. As a result, in this embodiment, for example, even when a terminal connected to the wire 500a is provided at the edge of each of the control chips 200 along the X direction, it is possible to prevent the distance between the terminal of each of the control chips 200 and the lead terminal 400a from being increased. In other words, in this embodiment, it is possible to prevent the wires 500a connecting the terminals of the control chips 200 and the lead terminal 400a from being increased in length. As a result, in this embodiment, it is possible to prevent processing (for example, fifth step 500 in FIG. 5 described below) connecting the wires 500a to the terminals of the control chips 200 and the lead terminal 400a from being complicated.

In this embodiment, a width WX100 in the X direction, which is a part of the lead terminal 400a where no opening HL is provided in the Y direction, is greater than two widths: the width WX10 of each of the openings HL in the X direction; and the width WX20 of each of the control chips 200 in the X direction. Therefore, in this embodiment, on the top surface TPa of the lead terminal 400a, connection areas at which the wires 500a are connected can be provided with ease in the portion where no opening HL is provided in the Y direction (portion having width WX100 in X direction greater than width WX20). This embodiment allows for connecting the wires 500a to the top surface TPa of the lead terminal 400a with ease.

Next, the cross-section of the semiconductor apparatus 10 taken along line B1-B2 in the plan view of the area AR1 will be described with reference to FIG. 3.

Figure 3:
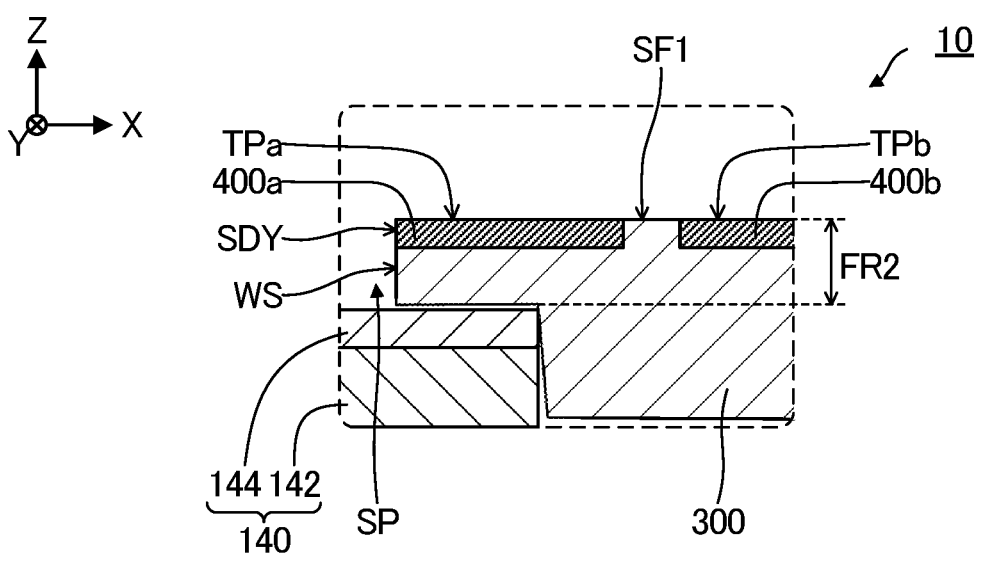
FIG. 3 is a cross-sectional view showing an example of a cross-section of the semiconductor apparatus taken along line B1-B2 shown in FIG. 2.

FIG. 3 is a cross-sectional view showing an example of the cross-section of the semiconductor apparatus 10 taken along line B1-B2 shown in FIG. 2. In FIG. 3, the wires 500 and other elements are omitted for clarity.

As shown in FIG. 3, the top surface TPa of the lead terminal 400a is exposed from the resin enclosure 300. For example, the top surface TPa of the lead terminal 400a and the first surface SF1 of the second frame portion FR2 are flat and continuous. In other words, the first surface SF1 of the second frame portion FR2 and the top surface TPa of the lead terminal 400a are positioned in the same plane. Furthermore, a side surface SDY of the lead terminal 400a close to the space SP and the inner wall surface WS of the second frame portion FR2 are flat and continuous. In other words, the inner wall surface WS of the second frame portion FR2 and the side surface SDY of the lead terminal 400a are positioned in the same plane.

In addition, the wires 500a are connected to a portion exposed from the resin enclosure 300, of the top surface TPa of the lead terminal 400a. In this embodiment, the control chips 200 are not arranged on the top surface TPa of the lead terminal 400a. Next, a mode (hereinafter, first comparative example) will be described in which the control chips 200 are arranged on the top surface TPa of the lead terminal 400a with reference to FIG. 4, to compare with the above-described first embodiment.

Figure 4:
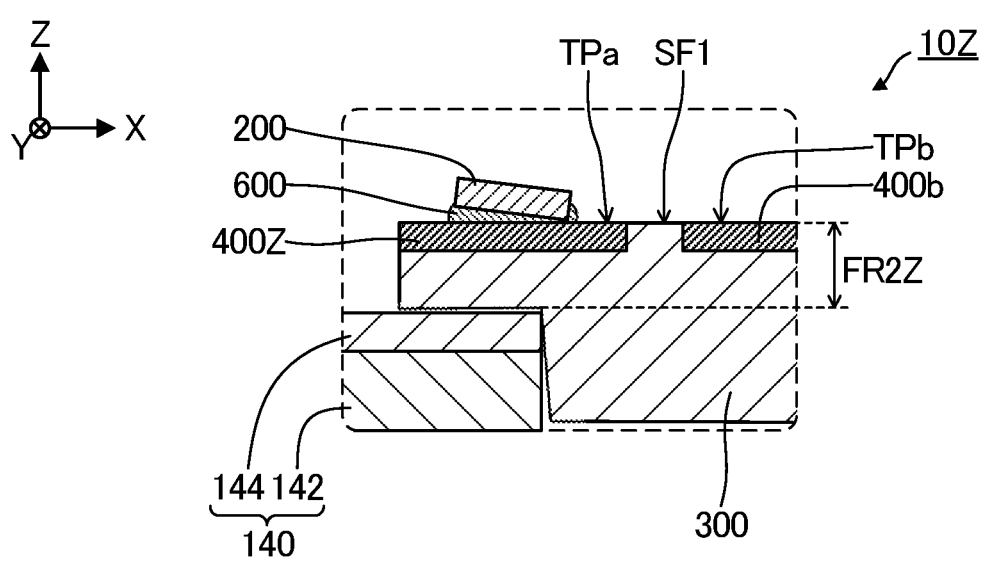
FIG. 4 shows an example of a semiconductor apparatus according to a first comparative example.

FIG. 4 shows an example of a semiconductor apparatus 10Z according to the first comparative example. FIG. 4 shows a cross-section of the semiconductor apparatus 10Z at a portion corresponding to the cross-section of the semiconductor apparatus 10 taken along line A1-A2 shown in FIG. 2. In FIG. 4, the wires 500 and other elements are omitted for clarity.

The semiconductor apparatus 10Z is similar to the semiconductor apparatus 10 except that the semiconductor apparatus 10Z includes a lead terminal 400Z in place of the lead terminal 400a shown in FIG. 1. The lead terminal 400Z is similar to the lead terminal 400a except that the openings HL shown in FIG. 1 are not provided. Therefore, a second frame portion FR2Z of the resin enclosure 300 is similar to the second frame portion FR2 except that the pedestal portions ST shown in FIG. 1 are not provided. In the semiconductor apparatus 10Z, the control chips 200 are bonded to the top surface TPa of the lead terminal 400Z with the insulating adhesive 600.

For example, a thickness of the adhesive 600 is determined by a diameter of a filler (not shown) contained in the adhesive 600. Therefore, if distribution of the filler diameter in the adhesive 600 is biased, the thickness of the adhesive 600 is partially reduced, which may cause the corresponding control chip 200 to be inclined. In this case, in the portion at which the adhesive 600 is thin, the distance between the corresponding control chip 200 and the lead terminal 400Z may be smaller, and insulation between the control chip 200 and the lead terminal 400Z may not be provided.

If insulation between the control chip 200 and the lead terminal 400Z is not provided, a withstand voltage between the control chip 200 and the lead terminal 400Z is reduced. In other words, in the first comparative example, the withstand voltage between the control chip 200 and the lead terminal 400Z may not be provided. The withstand voltage is durability performance maintaining in electrical insulation even when a high voltage is applied to an insulator. If the filler in the adhesive 600 is limited to one having a diameter of a predetermined value or more to reduce the thickness of the adhesive 600 to a predetermined thickness or less, cost of the adhesive 600 is increased.

In this embodiment, there is no lead terminal 400a below the control chips 200. Therefore, in this embodiment, even in the portion at which the thickness of the adhesive 600 bonding the control chips 200 to the resin enclosure 300 is reduced, insulation of the rear surfaces BS of the control chips 200 can be provided. In other words, in this embodiment, insulation of the rear surfaces BS of the control chips 200 can be provided independent from the thickness of the adhesive 600. In this embodiment, this makes it possible to provide insulation of the rear surfaces BS of the control chips 200 without increasing the cost of the adhesive 600. As a result, in this embodiment, the withstand voltage between each of the control chips 200 and the lead terminal 400a can be surely provided. In this embodiment, damage to the control chips 200 by a surge voltage or the like from outside of the semiconductor apparatus 10 may be prevented.

Next, a method of manufacturing the semiconductor apparatus 10 will be described with reference to FIG. 5.

Figure 5:
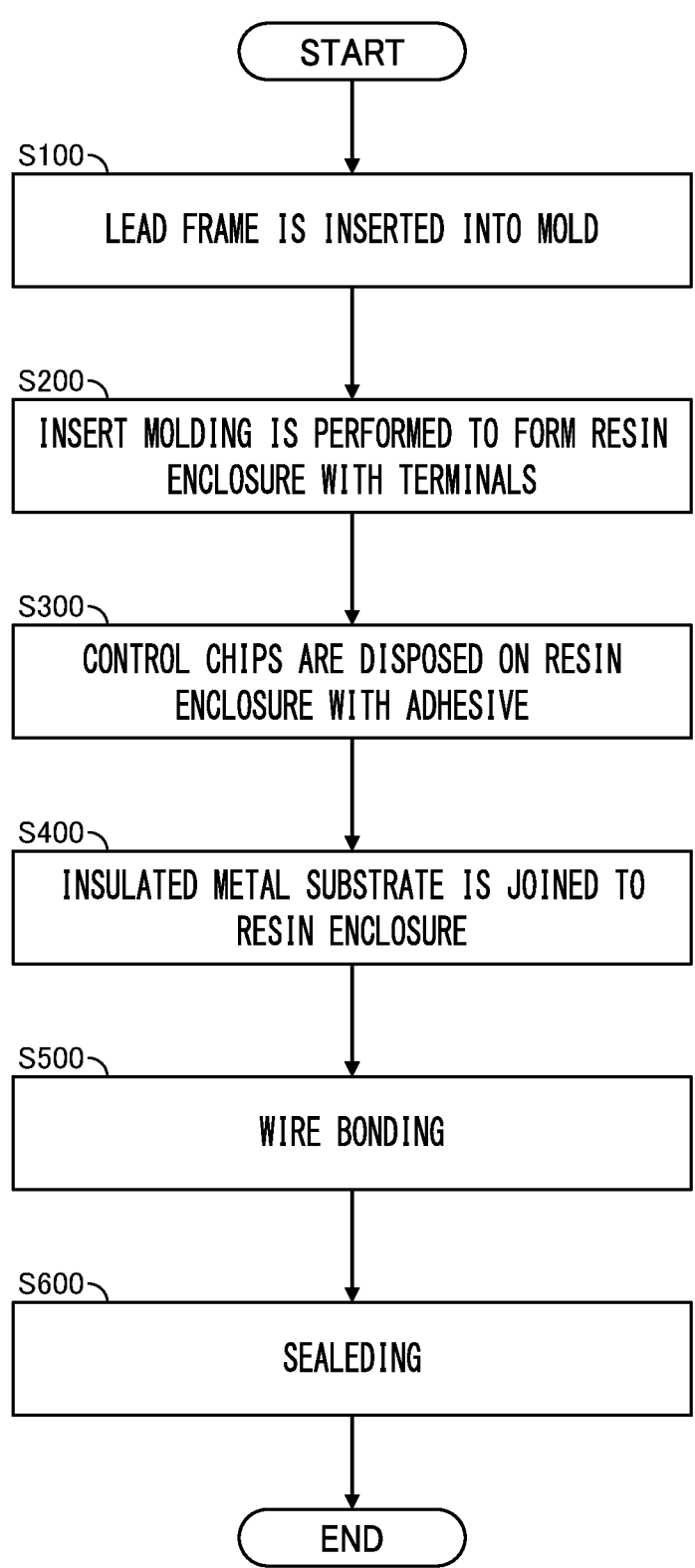
FIG. 5 shows a method of manufacturing the semiconductor apparatus shown in FIG. 1.

FIG. 5 shows the method of manufacturing the semiconductor apparatus 10 shown in FIG. 1.

First, in a first step S100, a lead frame including the lead terminals 400 is inserted into a mold for the resin enclosure 300. Before the first step S100, the openings HL may be formed in the lead terminal 400a included in the lead frame.

Next, in a second step S200, insert molding to form the lead terminals 400 with the resin enclosure 300 is performed. For example, in the second step S200, a resin, such as a PPS resin, is injected into a mold into which a lead frame has been inserted, and the lead frame is divided into the lead terminals 400 after the resin is cured. As a result, the resin enclosure 300 into which the lead terminals 400 have been inserted is formed. As described above, the resin enclosure 300 into which the lead terminals 400 have been inserted is formed by curing the resin injected into the mold. For example, in the second step S200, the resin enclosure 300 in which the pedestal portions ST are positioned inside the respective openings HL of the lead terminal 400a is formed.

Next, in a third step S300, the insulating adhesive 600 is applied to portions of the pedestal portions ST of the resin enclosure 300 where the control chips 200 are to be disposed. Then the control chips 200 are disposed on the respective portions at which the adhesive 600 is applied. In other words, in the third step S300, the control chips 200 are disposed on the respective pedestal portions ST of the resin enclosure 300 not overlapping with the lead terminal 400a, as seen in planar view.

Next, in a fourth step S400, the insulated metal substrate 140 is joined to the resin enclosure 300 so as to close the opening on the lower side of the resin enclosure 300. For example, before the fourth step S400, the circuit layers 120 may be disposed on the insulated metal substrate 140, and the chip pairs 100 (power semiconductor chips 102a and 102b) may be joined to the respective circuit layers 120. In other words, in the fourth step S400, the power semiconductor chips 102a are arranged in the space SP of the resin enclosure 300.

Next, in a fifth step S500, wire bonding is performed, in which the wires 500 is connected to terminals of the power semiconductor chips 102a, terminals of the power semiconductor chips 102b, terminals of the control chips 200, the lead terminals 400, and other elements. For example, in the fifth step S500, an end (first end) of each of the wires 500a is connected to the lead terminal 400a, and the other end (second end) of each of the wires 500a is connected to the control chips 200.

In this embodiment, the pedestal portions ST of the resin enclosure 300 are positioned inside the openings HL of the lead terminal 400a, which makes it possible to prevent the lead terminal 400a from being shifted in the X direction and the Y direction. In this embodiment, this makes it possible to prevent the position of the lead terminal 400a from being shifted in the wire bonding. As a result, in this embodiment, the wire bonding to connect the wires 500 to the lead terminal 400a can be stably performed.

Next, in a sixth step S600, sealing treatment to seal the circuit layers 120, the chip pairs 100 (power semiconductor chips 102a and 102b), the control chips 200, the wires 500, and other elements, with the sealing resin 700 is performed. For example, in the sealing treatment, a liquid resin (material of sealing resin 700) is injected into the space inside resin enclosure 300 from the opening on the upper side of the resin enclosure 300. Thereafter, in heat-curing treatment, the resin injected into the resin enclosure 300 is heated and cured. As a result, the semiconductor apparatus 10 shown in FIG. 1 is obtained.

The method of manufacturing the semiconductor apparatus 10 is not limited to the example shown in FIG. 5. For example, heat-curing treatment may be performed as necessary in which the adhesive 600 for bonding the control chips 200 to the resin enclosure 300, and the substrate joining portion for joining the insulated metal substrate 140 to the resin enclosure 300 are heated and cured. Specifically, after the fourth step S400 and before the fifth step S500, the heat-curing treatment may be performed. Furthermore, for example, the fourth step S400 may be executed before the third step S300.

As described above, in this embodiment, the semiconductor apparatus 10 includes the power semiconductor chips 102a, the resin enclosure 300 having the space SP in which the power semiconductor chips 102 are positioned, the lead terminal 400a arranged in the resin enclosure 300, the control chips 200, and the wires 500a. The control chips 200 are disposed on the pedestal portions ST of the resin enclosure 300 not overlapping with the lead terminal 400a, as seen in a planar view from a direction (Z direction) perpendicular to the top surface TPa of the lead terminal 400a. The control chips 200 controls the power semiconductor chips 102a. Each of the wires 500a has an end (first end) connected to the lead terminal 400a, and the other end connected to the control chips 200.

As described above, in this embodiment, the control chips 200 are disposed on the respective pedestal portions ST of the resin enclosure 300 not overlapping with the lead terminal 400a, as seen in planar view. In this embodiment, this makes it possible to provide insulation of the rear surfaces BS of the control chips 200. As a result, in this embodiment, it is possible to improve reliability of the semiconductor apparatus 10 in which the control chips 200 and the lead terminal 400a are arranged on the resin enclosure 300.

In this embodiment, the lead terminal 400a has the openings HL. The pedestal portions ST of the resin enclosure 300 are positioned inside the respective openings HL of the lead terminal 400a. In this embodiment, this makes it possible to prevent the lead terminal 400a from being shifted in the X direction and the Y direction.

A2: Second Embodiment

Figure 6:
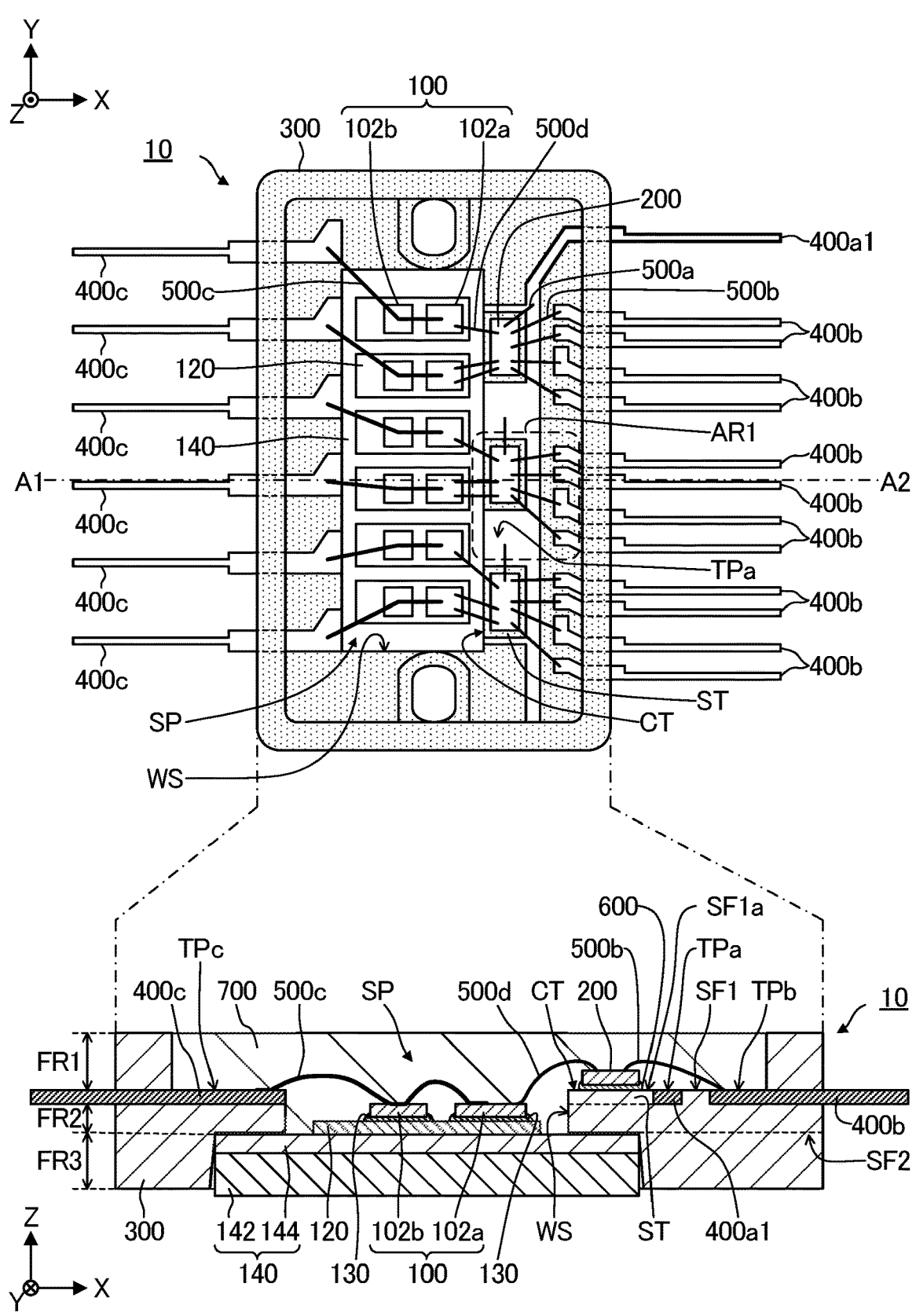
FIG. 6 shows an example of a semiconductor apparatus according to a second embodiment.

FIG. 6 shows an example of the semiconductor apparatus 10 according to a second embodiment. FIG. 6 is a plan view of the semiconductor apparatus 10 when viewed from the +Z direction and a cross-sectional view of the semiconductor apparatus 10 taken along line A1-A2. Elements similar to the elements described with reference to FIGS. 1 to 5 are denoted by similar reference numerals, and detailed description of the elements is omitted.

The semiconductor apparatus 10 shown in FIG. 6 is similar to the semiconductor apparatus 10 shown in FIG. 1 except that the semiconductor apparatus 10 shown in FIG. 6 includes a lead terminal 400a1 in place of the lead terminal 400a shown in FIG. 1. In the following, the lead terminal 400a1 is mainly described.

The lead terminal 400a1 is similar to the lead terminal 400a shown in FIG. 1 except that notches CT are provided in place of the openings HL shown in FIG. 1. For example, as shown in plan view in FIG. 6, the notches CT are provided with intervals in the Y direction in a portion of the lead terminal 400a1 extending in the Y direction. The lead terminal 400a1 is an example of a "lead terminal", and each of the notches CT is an example of a "notch".

The pedestal portions ST of the resin enclosure 300 are positioned inside the respective notches CT of the lead terminal 400a1. For example, as shown in the cross-sectional view of FIG. 6, the pedestal portions ST of the resin enclosure 300 are provided inside the respective notches CT so as to fill the notches CT. In this embodiment, side surfaces of the pedestal portions ST close to the space SP are positioned in the same plane as the inner wall surface WS of the second frame portion FR2. The control chips 200 are bonded to the surfaces SF1a of the pedestal portions ST positioned inside the notches CT with the insulating adhesive 600. For example, the control chips 200 are disposed on the respective corresponding pedestal portions ST so as not to contact the lead terminal 400a1.

As described above, in this embodiment, since the control chips 200 are disposed on the pedestal portions ST of the resin enclosure 300 positioned inside the notches CT provided in the lead terminal 400a1, the lead terminal 400a1 is not present below the control chips 200. Therefore, in this embodiment, it is possible to provide insulation between the control chips 200 and the lead terminal 400a1.

In this embodiment, the control chips 200 are positioned inside the notches CT of the lead terminal 400a1, as seen in planar view. Accordingly, it is possible to prevent distances between the control chips 200 and each of the parts therearound (power semiconductor chips 102a, lead terminals 400a1 and 400b) from being increased. As a result, in this embodiment, it is possible to prevent the wires 500a, 500b, 500d, and other elements connected to control chips 200 from being increased in length.

Next, the notches CT of lead terminal 400a1 are described with reference to FIG. 7.

Figure 7:
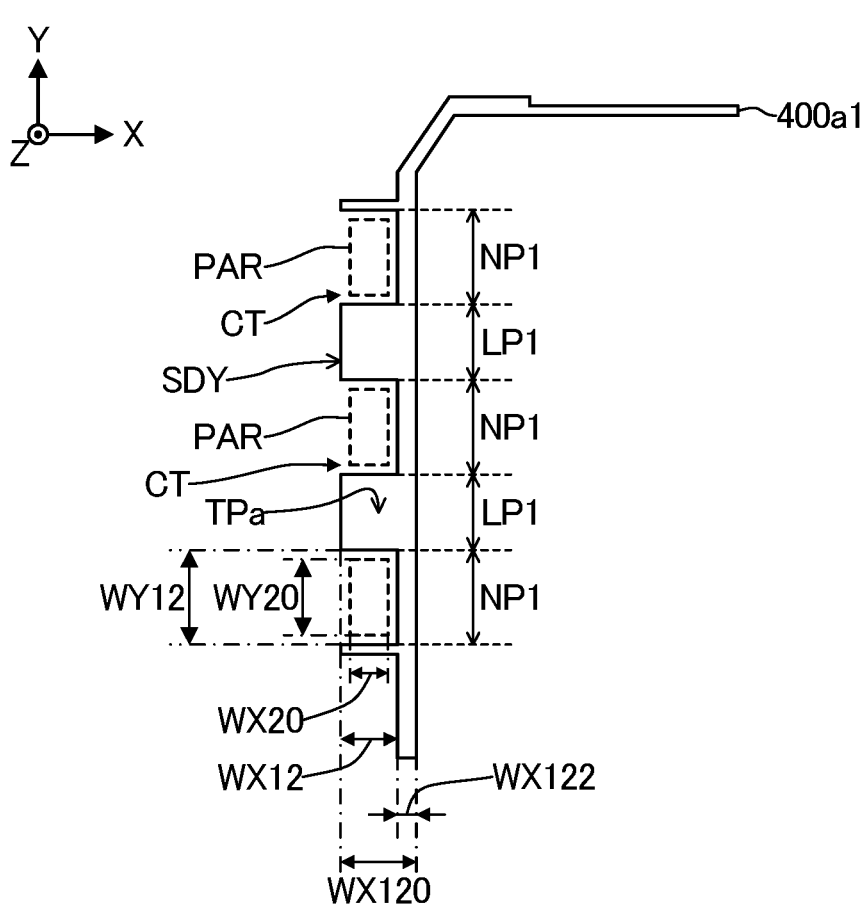
FIG. 7 shows an example of a lead terminal shown in FIG. 6.

FIG. 7 shows an example of the lead terminal 400a1 shown in FIG. 6. FIG. 7 is a plan view of the lead terminal 400a1 when viewed from the +Z direction. Dashed rectangles in FIG. 7 illustrate chip arrangement areas PAR where the control chips 200 are disposed.

In the portion of the lead terminal 400a1 extending in the Y direction, the notches CT each opening in the −X direction are provided with intervals in the Y direction. Specifically, the notches CT each opening in the −X direction are provided on the side surface SDY positioned in the −X direction out of the two side surfaces of the lead terminal 400a1 along the Y direction. The space SP is positioned in the −X direction more than the side surface SDY of the lead terminal 400a1 (see FIG. 6). In other words, in this embodiment, the notches CT of the lead terminal 400a1 each open toward the space SP, as seen in planar view.

For example, the lead terminal 400a1 includes widewidth portions LP1 and narrow-width portions NP1. Each of the narrow-width portions NP1 has a width WX122 in the X direction less than a width WX120 of each of the wide-width portions LP1 in the X direction. Each of the narrow-width portions NP1 connects the adjacent wide-width portions LP1. A space surrounded from three directions (+Y direction, −Y direction, and +X direction) by two wide-width portions LP1 adjacent in the Y direction and one narrowwidth portion NP1 connecting the two wide-width portions LP1 is one notch CT. Each of the notches CT differs from each of the openings HL in that each of the notches CT is surrounded from three directions by a part (wide-width portions LP1 and narrow-width portion NP1) of the lead terminal 400a1, whereas each of the openings HL is surrounded from four directions (+Y direction, −Y direction, +X direction, and −X direction) by a part of the lead terminal 400a.

For example, the area inside each of the notches CT (area where each pedestal portion ST is provided) is rectangular, as seen in planar view. The side surface SDY (side surface SDY in a portion provided with no notch CT) of the lead terminal 400a1 close to the space SP is positioned in the same plane as the inner wall surface WS of the second frame portion FR2, as with the side surface SDY of the lead terminal 400a described above with reference to FIG. 3.

In this embodiment, the entirety of each of the control chips 200 are positioned inside the respective notches CT of the lead terminal 400a1, as seen in planar view. Therefore, each of the notches CT of the lead terminal 400a1 is formed such that the following (i) and (ii) are satisfied: (i) a width WX12 in the X direction is greater than the width WX20 of each of the control chips 200 in the X direction, and (ii) a width WY12 in the Y direction is greater than the width WY20 of each of the control chips 200 in the Y direction. Each of the notches CT is formed in a long shape in which the width WY12 in the Y direction is greater than the width WX12 in the X direction. The width WX12 of each of the notches CT is greater than the width WX122 of each of the narrow-width portions NP1 of the lead terminal 400a1.

As described above, in this embodiment, the lead terminal 400a1 includes the notches CT. Accordingly, it is possible to arrange the control chips 200 so as not to overlap with the lead terminal 400a1, as seen in planar view. Additionally, it is possible to prevent the width WX120 of the lead terminal 400a1 in the X direction from being reduced. This embodiment allows for connection of the wires 500a to the top surface TPa of the lead terminal 400a1 with ease.

In this embodiment, since the pedestal portions ST are provided inside the respective notches CT each opening in the −X direction, the lead terminal 400a1 is not present on −X direction sides of the pedestal portions ST. Therefore, in this embodiment, the width WX120 of the lead terminal 400a1 can be reduced as compared with a mode (for example, first embodiment described above) in which a part of the lead terminal 400a is disposed on the +X direction sides and the −X direction sides of the pedestal portions ST. The width WX120 of the lead terminal 400a1, however, is preferably a width that does not make it difficult to connect the wires 500a to the lead terminal 400a1 difficult.

Furthermore, in this embodiment, the width WX120 of the lead terminal 400a1 can be reduced. This enables formation of the notches CT in the lead terminal 400a1 even in a case in which the width WX120 of the lead terminal 400a1 is less than a width sufficient to form the opening HL. As a result, in this embodiment, the semiconductor apparatus 10 can be reduced in size.

In this embodiment, since the notches CT of the lead terminal 400a1 each open in the −X direction, the lead terminal 400a1 is not present on the −X direction sides of the control chips 200. Therefore, in this embodiment, as compared with a mode in which a part of the lead terminal 400a1 is disposed on the −X direction sides of the control chips 200, it is possible to arrange the control chips 200 near the power semiconductor chips 102a. In this embodiment, this makes it possible to reduce the distance between each of the control chips 200 and the corresponding power semiconductor chip 102a.

In this embodiment, an example in which the notches CT of the lead terminal 400a1 each open in the −X direction has been described. However, the notches CT of the lead terminal 400a1 each may open in the +X direction (direction opposite to direction in which space SP is positioned). In the mode in which the notches CT each open in the +X direction, a part (narrow-width portions NP1) of the lead terminal 400a1 is disposed on the −X direction sides of the control chips 200. In the mode in which the notches CT each open in the +X direction, the width WX120 of the lead terminal 400a1 can be reduced as compared with the mode (for example, first embodiment described above) in which a part of the lead terminal 400a is disposed on the +X direction sides and the −X direction sides of the pedestal portions ST.

As described above, in this embodiment, the lead terminal 400a1 includes the notches CT. Furthermore, at least a part of each of the pedestal portions ST of the resin enclosure 300 is positioned inside the corresponding notch CT of the lead terminal 400a1. In this embodiment, the control chips 200 are disposed on the respective pedestal portions ST not overlapping with the lead terminal 400a1, as seen in planar view. For example, in this embodiment, the entirety of the control chips 200 are positioned inside the respective notches CT of the lead terminal 400a1, as seen in planar view. This embodiment can achieve effects similar to the effects by the above-described first embodiment.

In this embodiment, the notches CT of the lead terminal 400a1 each open toward the space SP, as seen in planar view. Therefore, in this embodiment, the lead terminal 400a1 is not disposed between each of the pedestal portions ST and the space SP. As a result, in this embodiment, the control chips 200 can be arranged near the space SP in which the power semiconductor chips 102a are positioned.

A3: Third Embodiment

Figure 8:
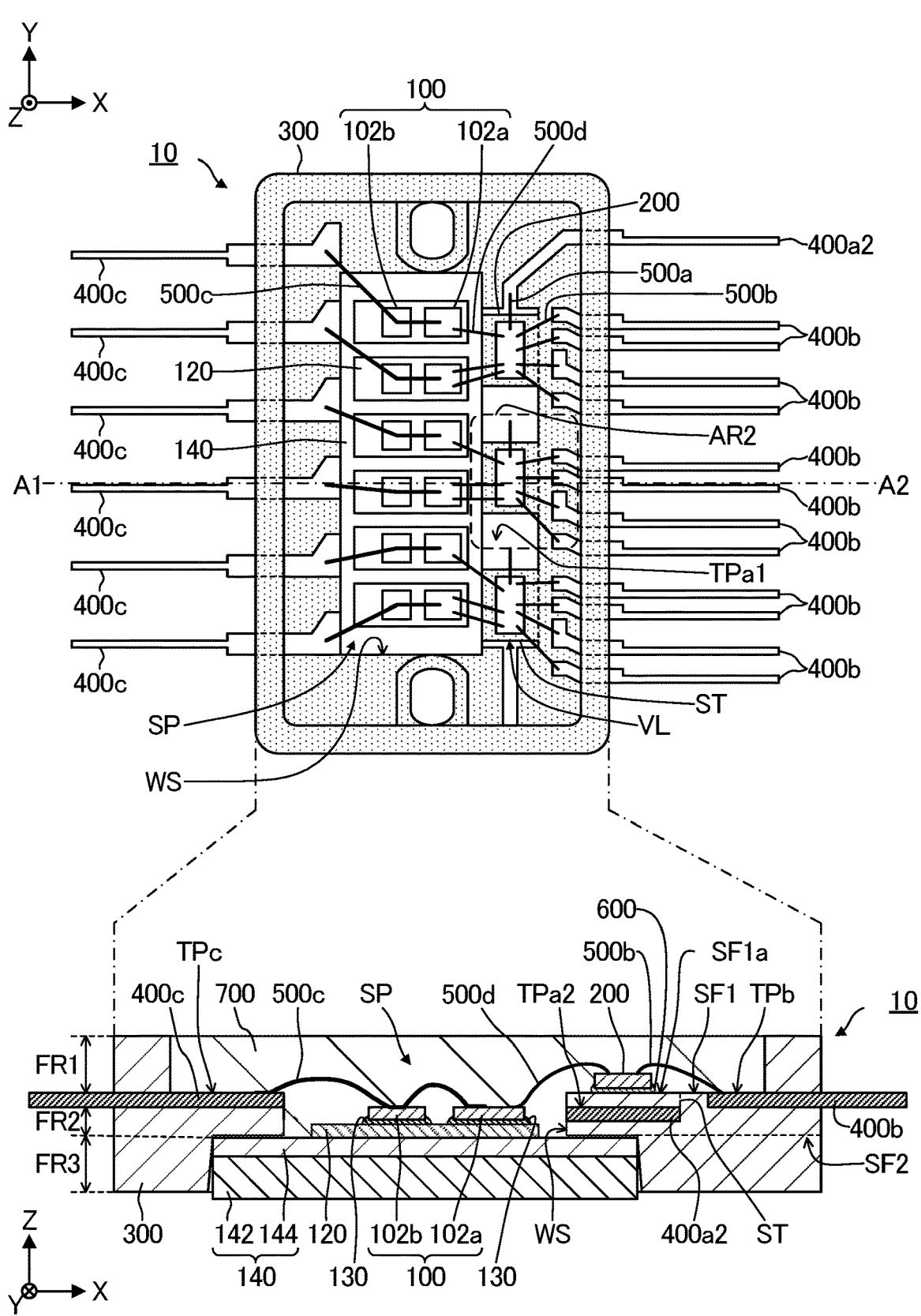
FIG. 8 shows an example of a semiconductor apparatus according to a third embodiment.

FIG. 8 shows an example of the semiconductor apparatus 10 according to a third embodiment. FIG. 8 is a plan view of the semiconductor apparatus 10 when viewed from the +Z direction and a cross-sectional view of the semiconductor apparatus 10 taken along line A1-A2. Elements similar to the elements described with reference to FIGS. 1 to 7 are denoted by similar reference numerals, and detailed description of these elements is omitted. In FIG. 8, a top surface TPa of a lead terminal 400a2 is referred to as a top surface TPa1 or a top surface TPa2. The lead terminal 400a2 is an example of a "lead terminal". The top surface TPa1 is an example of a "first top surface", and the top surface TPa2 is an example of a "second top surface".

The semiconductor apparatus 10 shown in FIG. 8 is similar to the semiconductor apparatus 10 shown in FIG. 1 except that the lead terminal 400a2 is provided in place of the lead terminal 400a shown in FIG. 1, and the control chips 200 are disposed at respective positions overlapping with the lead terminal 400a2, as seen in planar view. In the following, the lead terminal 400a2 is mainly described.

The lead terminal 400a2 is similar to the lead terminal 400a shown in FIG. 1 except that recesses VL are provided in place of the openings HL shown in FIG. 1. For example, as shown in the plan view of FIG. 8, the recesses VL are provided with intervals in the Y direction in a portion of the lead terminal 400a2 extending in the Y direction. For example, the recesses VL are provided corresponding to the control chips 200. The recesses VL of the lead terminal 400a2 are described with reference to FIG. 9 described below.

As shown in the cross-sectional view of FIG. 8, the pedestal portions ST of the resin enclosure 300 are positioned between the top surface TPa2 of the lead terminal 400a2 and the control chips 200. The control chips 200 are bonded to the surfaces SF1a of the pedestal portions ST positioned on the top surface TPa2 of the lead terminal 400a2, with the insulating adhesive 600. For example, the control chips 200 are disposed on the respective corresponding pedestal portions ST so as not to contact with the lead terminal 400a2.

Next, the recesses VL of the lead terminal 400a2 and the pedestal portions ST of the resin enclosure 300 are described with reference to FIG. 9.

Figure 9:
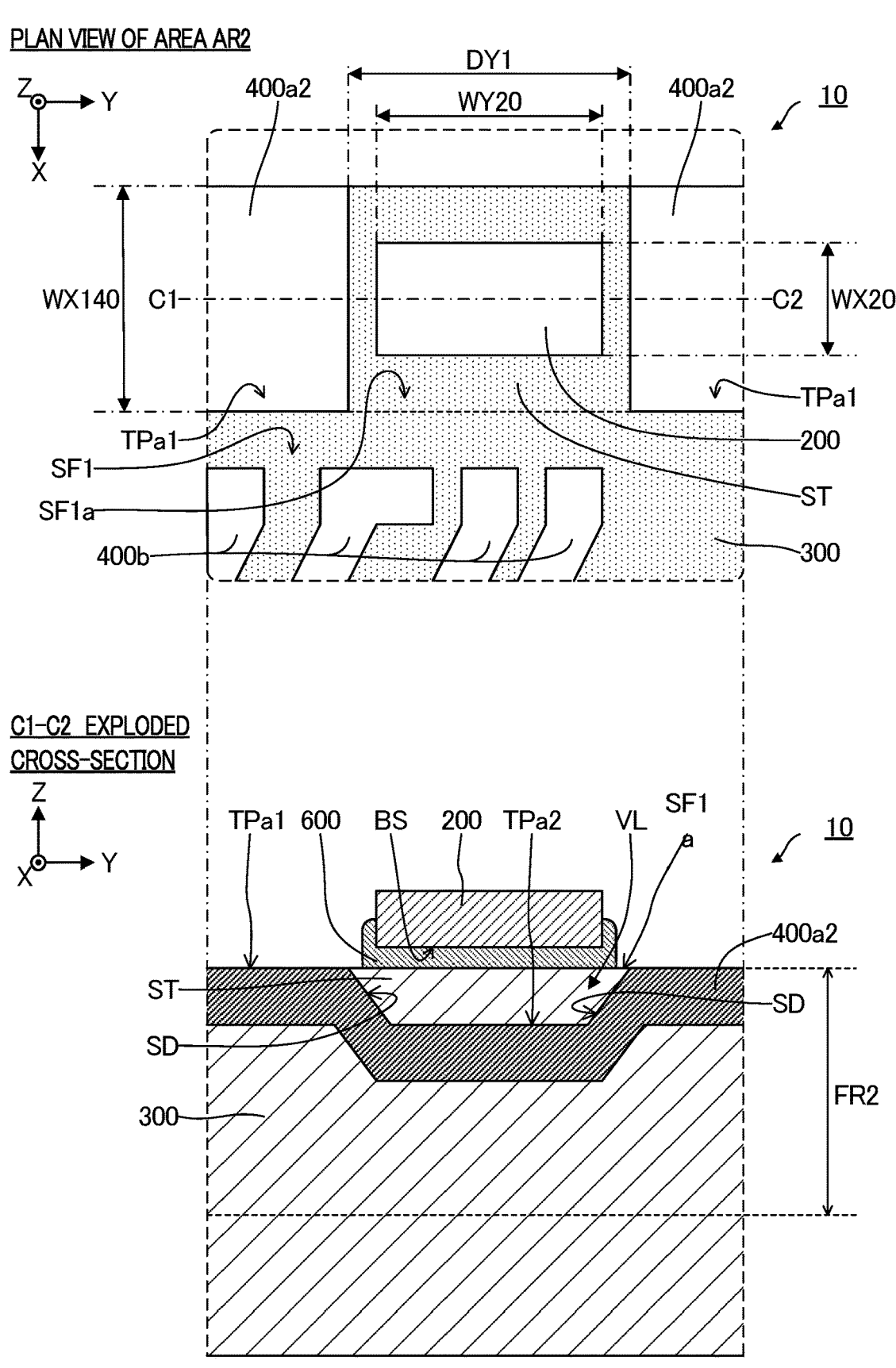
FIG. 9 shows a recess and a pedestal portion shown in FIG. 8.

FIG. 9 is an explanatory diagram of one of the recesses VL and the corresponding pedestal portion ST shown in FIG. 8. A plan view of FIG. 9 is a plan view of an area AR2 enclosed by a dashed line shown in the plan view of FIG. 1. A C1-C2 cross-sectional view illustrates a cross-section of the semiconductor apparatus 10 taken along line C1-C2 in the plan view of the area AR2. In FIG. 9, the wires 500 and other elements are omitted for clarity.

As shown in the C1-C2 cross-sectional view, the lead terminal 400a2 includes the top surface TPa1 to which the wires 500a are connected, and the top surface TPa2 recessed from the top surface TPa1. The lead terminal 400a2 further includes side surfaces SD connecting the top surface TPa1 and the top surface TPa2. For example, the top surface TPa2 is parallel to the top surface TPa1, and positioned in the −Z direction more than the top surface TPa1. Each of the side surfaces SD may be an inclined surface inclined to the top surface TPa2 at a predetermined angle. The recesses VL are formed by a level difference between the top surface TPa1 and the top surface TPa2. In other words, each of the recesses VL of the lead terminal 400a2 is defined by the top surface TPa2 and the side surfaces SD. For example, the top surface TPa2 of the lead terminal 400a2 corresponds to a bottom surface of each of the recesses VL, and the side surfaces SD of the lead terminal 400a2 correspond to the side surfaces of each of the recesses VL. The recesses VL are formed over the entire width of the lead terminal 400a2.

The pedestal portions ST of the resin enclosure 300 are formed on the top surface TPa2 of the lead terminal 400a2 so as to fill the recesses VL of the lead terminal 400a2. For example, the surfaces SF1a of the pedestal portions ST, the top surface TPa1 of the lead terminal 400a2, and the first surface SF1 of the second frame portion FR2 are positioned in the same plane. The surfaces SF1a of the pedestal portions ST positioned on the top surface TPa2 of the lead terminal 400a2 and the rear surfaces BS of the control chips 200 are bonded with the adhesive 600. For example, a cross-section parallel to a Y-Z plane of each of the pedestal portions ST is trapezoidal (isosceles trapezoidal in the example shown in FIG. 9).

As shown in the plan view of the area AR2, a range of each of the pedestal portions ST in the X direction covers the entire width of the lead terminal 400a2. A range of each of the pedestal portions ST in the Y direction is a range from a boundary between one of the two side surfaces SD and the top surface TPa1 to a boundary between the other of the two side surfaces SD and the top surface TPa1. In other words, each of the pedestal portions ST is a portion overlapping with the top surface TPa2 and the side surfaces SD, as seen in planar view. In the +X direction, each of the pedestal portions ST is continuous with the other portion of the resin enclosure 300 (for example, portion between lead terminal 400a2 and each of lead terminals 400b of resin enclosure 300). The side surfaces of the pedestal portions ST in the −X direction are positioned in the same plane as the inner wall surface WS of the second frame portion FR2 as shown in the cross-sectional view of FIG. 8 described above.

As described above, the control chips 200 are disposed on the surfaces SF1a of the pedestal portions ST. For example, as seen in planar view, the entirety of the control chips 200 are positioned on the pedestal portions ST of the resin enclosure 300. As seen in planar view, the entirety of the control chips 200 may be positioned in the top surface TPa2 of the lead terminal 400a2. In this embodiment, the lead terminal 400a2 is formed such that the following is satisfied: (i) width WX140 in the X direction is greater than width WX20 of each of the control chips 200 in the X direction, and (ii) distance DY1 of the top surface TPa1 is greater than width WY20 of each of the control chips 200 in the Y direction. Width WX140 of the lead terminal 400a2 corresponds to a width of each of the pedestal portions ST in the X direction. The distance DY1 of the top surface TPa1 corresponds to the width of each of the pedestal portions ST in the Y direction.

Width WX140 of the lead terminal 400a2 may be less than width WX20 of each of the control chips 200 as long as the process for connecting the wires 500a to the top surface TPa1 of the lead terminal 400a2 is not made difficult. In other words, as seen in planar view, a part of each of the control chips 200 may be positioned in the top surface TPa2 of the lead terminal 400a2.

As described above, in this embodiment, each of the pedestal portions ST of the resin enclosure 300 is present between each of the control chips 200 and the lead terminal 400a2. The control chips 200 do not overlap with the top surface TPa1 of the lead terminal 400a2, as seen in planar view. As a result, in this embodiment, for example, even in the portion at which the thickness of the adhesive 600 is reduced, the distance between the corresponding control chip 200 and the lead terminal 400a2 can be provided by the thickness of the pedestal portion ST in the Z direction. Accordingly, in this embodiment, it is possible to reliably insulate the control chips 200 and the lead terminal 400a2 without increasing the cost of the adhesive 600. As a result, in this embodiment, the withstand voltage between each of the control chips 200 and the lead terminal 400a2 can be reliably provided. In this embodiment, this makes it possible to prevent the control chips 200 from being broken by a surge voltage or the like from outside of the semiconductor apparatus 10.

In the first comparative example shown in FIG. 4 described above, there is a mode (hereinafter, second comparative example) in which each of the pedestal portions ST of the resin enclosure 300 is interposed between each of the control chips 200 and the lead terminal 400Z.

Figure 10:
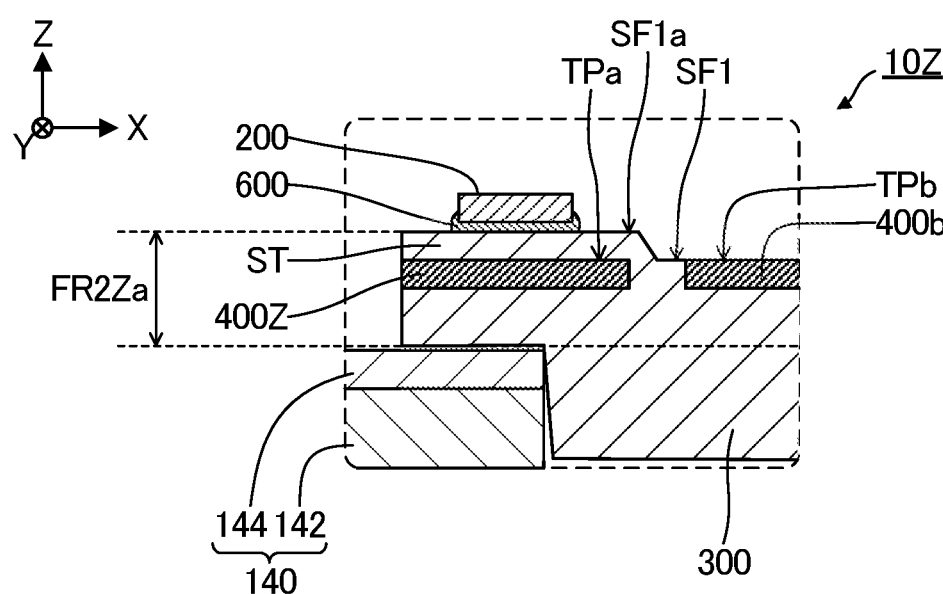
FIG. 10 shows an example of a semiconductor apparatus according to a second comparative example.

FIG. 10 shows an example of the semiconductor apparatus 10Z according to the second comparative example. FIG. 10 shows a cross-section of the semiconductor apparatus 10Z at a portion corresponding to the cross-section of the semiconductor apparatus 10 taken along line A1-A2 shown in FIG. 8. In FIG. 10, the wires 500 and other elements are omitted for clarity.

The semiconductor apparatus 10Z according to the second comparative example is similar to the semiconductor apparatus 10Z according to the first comparative example (semiconductor apparatus 10Z shown in FIG. 4) except that the pedestal portions ST are provided in a second frame portion FR2Za of the resin enclosure 300. Therefore, the lead terminal 400Z does not include the recesses VL. For example, in the second comparative example, the lead frame including the lead terminals 400 is planar. Accordingly, the top surface TPa of the lead terminal 400Z and the top surfaces TPb of the lead terminals 400b are positioned in the same plane. Thus, in the second comparative example, the surfaces SF1a of the pedestal portions ST provided on the lead terminal 400Z are positioned in the +Z direction more than the top surface TPa of the lead terminal 400Z.

In contrast, in this embodiment, as described above with reference to FIG. 9, the lead terminal 400a2 includes the recesses VL, and the pedestal portions ST are provided inside the respective recesses VL. In this embodiment, for example, the positions of the surfaces SF1a of the pedestal portions ST in the Z direction are the same as the position of the top surface TPa1 of the lead terminal 400a2 in the Z direction. Accordingly, in this embodiment, a height of the second frame portion FR2 including the pedestal portions ST is less than a height of the second frame portion FR2Za in the second comparative example. As a result, in this embodiment, the height of the semiconductor apparatus 10 in the Z direction can be reduced as compared with the second comparative example.

As described above, in this embodiment, the semiconductor apparatus 10 includes the power semiconductor chips 102a, the resin enclosure 300 including the space SP in which the power semiconductor chips 102a are positioned, the lead terminal 400a2 arranged in the resin enclosure 300, the control chips 200, and the wires 500a. The lead terminal 400a2 includes the top surface TPa recessed from the top surface TPa1 to which the wires 500a are connected. The resin enclosure 300 includes the pedestal portions ST provided on the top surface TPa1 of the lead terminal 400a2. The control chips 200 are disposed on the pedestal portions ST of the resin enclosure 300 so as not contact the lead terminal 400a2, and control the power semiconductor chips 102a.

As described above, in this embodiment, each of the pedestal portions ST of the resin enclosure 300 is present between each of the control chips 200 and the lead terminal 400a2. In this embodiment, this makes it possible to reliably provide insulation of the rear surfaces BS of the control chips 200 (for example, insulation between each of control chips 200 and lead terminal 400a2).

In this embodiment, as seen in planar view, the entirety of each of the control chips 200 is positioned in the top surface TPa2 of the lead terminal 400a2. Therefore, in this embodiment, it is possible to prevent the distances between the control chips 200 and each of the power semiconductor chips 102a and the lead terminals 400a2 and 400b from being increased. As a result, in this embodiment, it is possible to prevent the wires 500a, 500b, 500d, and other wires connected to the control chips 200 from being increased in length.

B: MODIFICATIONS

The embodiments exemplified above can be variously modified. Specific modifications which can be applied to the above-described embodiments are exemplified below. Two or more modifications optionally selected from the following modifications may be combined as long as they do not conflict.

B1: First Modification

In the above-described first embodiment, the case in which the width WX100 in the X direction of the portion of the lead terminal 400a between the openings HL is greater than the width WX10 of each of the openings HL in the X direction is exemplified; however, the present disclosure is not limited to such an aspect. For example, a portion of the lead terminal 400a between the openings HL may have a width in the X direction less than the width WX10 of each of the openings HL in the X direction.

Figure 11:
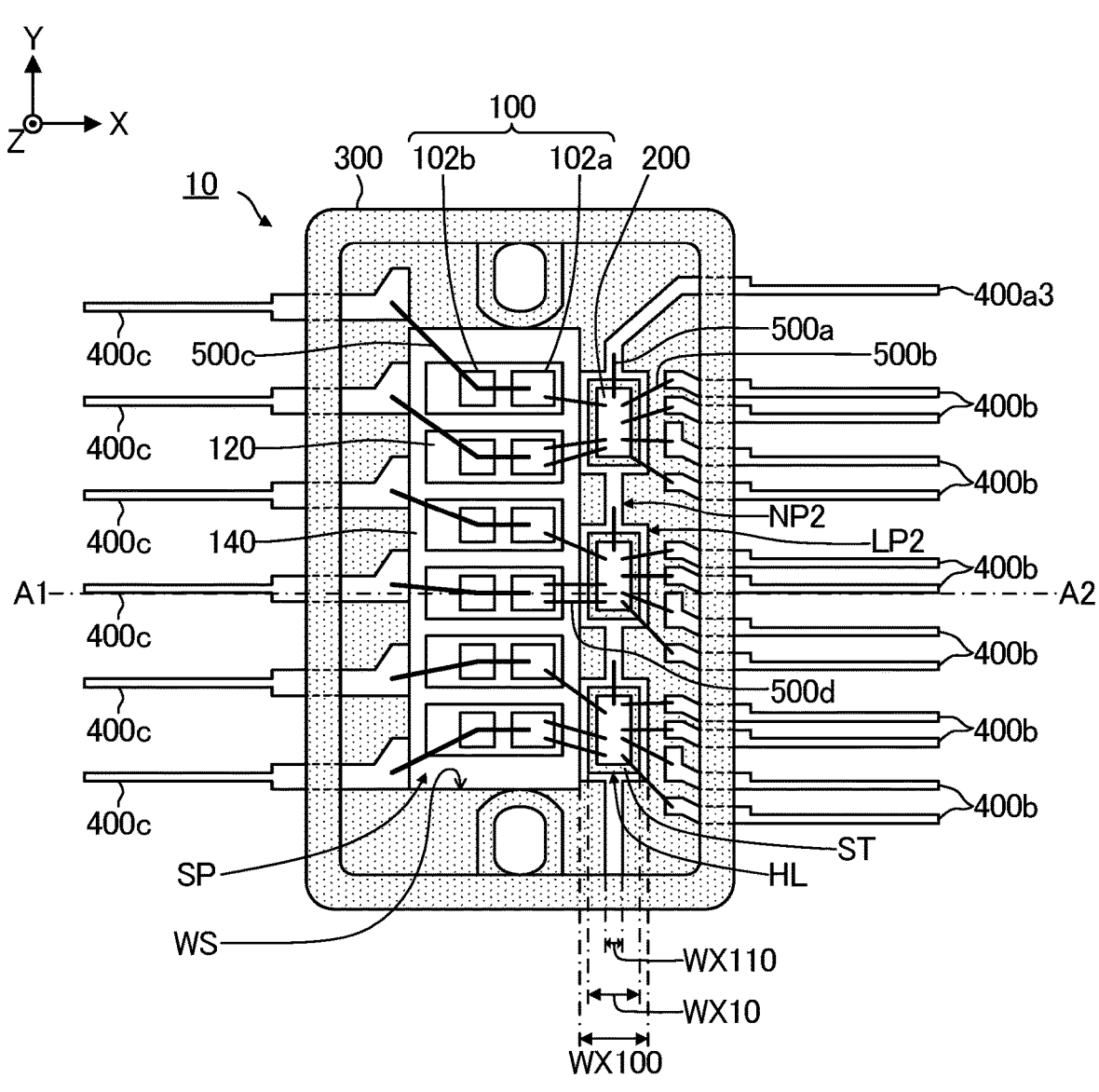
FIG. 11 shows an example of a semiconductor apparatus according to a first modification.

FIG. 11 shows an example of the semiconductor apparatus 10 according to a first modification. FIG. 11 is a plan view of the semiconductor apparatus 10 when viewed from the +Z direction. Elements similar to the elements described with reference to FIGS. 1 to 10 are denoted by similar reference numerals, and detailed description of the elements is omitted.

The semiconductor apparatus 10 shown in FIG. 11 is similar to the semiconductor apparatus 10 shown in FIG. 1 except that the semiconductor apparatus 10 shown in FIG. 11 includes a lead terminal 400a3 in place of the lead terminal 400a shown in FIG. 1. In the following, the lead terminal 400a3 is mainly described.

The lead terminal 400a3 includes wide-width portions LP2 in which the openings HL are provided, and narrow-width portions NP2 each connecting the adjacent wide-width portions LP2. A width WX110 of each of the narrow-width portions NP2 in the X direction is less than a width WX100 of each of the wide-width portions LP2 in the X direction. The width WX110 of each of the narrow-width portions NP2 in the X direction, however, is preferably a width that does not make it difficult to connect the wires 500a to the lead terminal 400a3.

The present modification can achieve effects similar to the effects by the above-described first embodiment.

B2: Second Modification

In the above-described second embodiment, a case has been described in which, as seen in planar view, the entirety of each of the control chips 200 is positioned inside the respective notches CT of the lead terminal 400a1. However, the present disclosure is not limited to such an aspect. For example, as seen in planar view, a part of each of the control chips 200 may protrude from the corresponding notch CT of the lead terminal 400a1.

Figure 12:
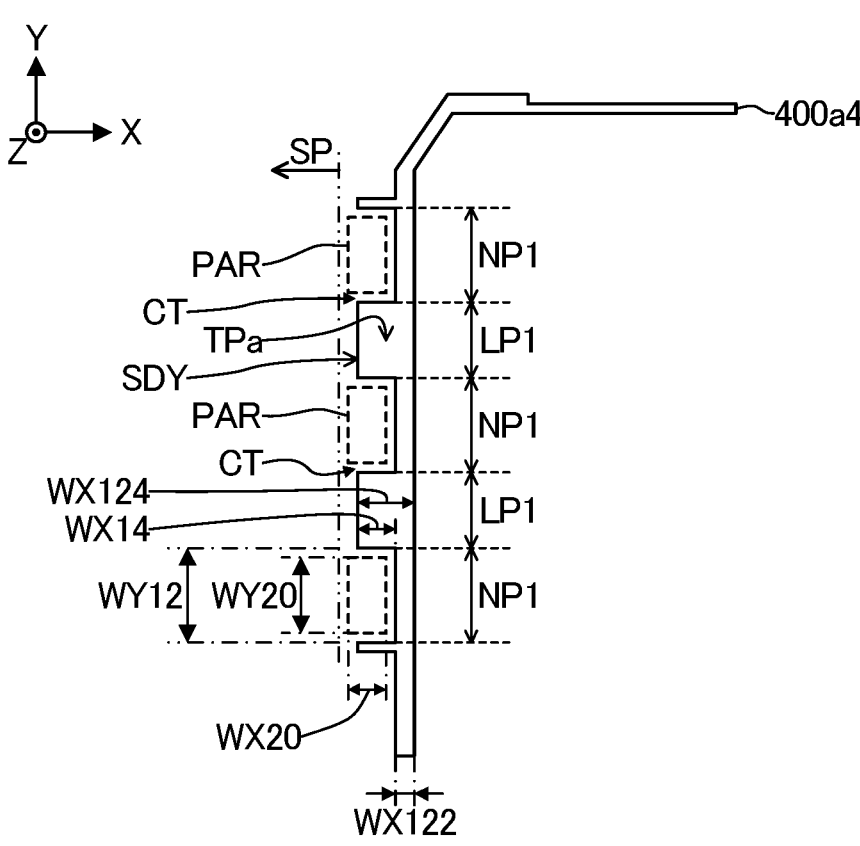
FIG. 12 shows an example of a semiconductor apparatus according to a second modification.

FIG. 12 shows an example of the semiconductor apparatus 10 according to a second modification. Elements similar to the elements described with reference to FIGS. 1 to 11 are denoted by similar reference numerals, and detailed description of the elements is omitted. FIG. 12 is a plan view of a lead terminal 400a4 when viewed from the +Z direction. Dashed rectangles in FIG. 12 illustrate chip arrangement areas PAR where the control chips 200 are disposed. A line of alternating long dash and two short dashes in FIG. 12 illustrates a position of the inner wall surface WS (see FIG. 1) of the second frame portion FR2, as seen in planar view. The space SP is positioned on the −X direction side of the line of alternating long dash and two short dashes.

The semiconductor apparatus 10 according to the second modification is similar to the semiconductor apparatus 10 shown in FIG. 6 except that the semiconductor apparatus 10 according to the second modification includes the lead terminal 400a4 in place of the lead terminal 400a1 shown in FIG. 6.

The lead terminal 400a4 is similar to the lead terminal 400a1 shown in FIG. 7 except that a width WX124 in the X direction is less than the width WX120 in the X direction of the lead terminal 400a1 shown in FIG. 7. For example, the notches CT each opening in the −X direction are provided with intervals in the Y direction in a portion of the lead terminal 400a4 extending in the Y direction.

In the present modification, as seen in planar view, a part of each of the chip arrangement areas PAR is positioned inside the corresponding notch CT of the lead terminal 400a4, and the other part is positioned outside the corresponding notch CT. The chip arrangement areas PAR are included in the pedestal portions ST of the resin enclosure 300. Therefore, in the present modification, a part of each of the pedestal portions ST of the resin enclosure 300 is positioned inside the corresponding notch CT of the lead terminal 400a4.

In the example shown in FIG. 12, width WX122, in the X direction of each of the portions at which the notches CT are provided, of the lead terminal 400a4, is equal to the width WX122 of the lead terminal 400a1 shown in FIG. 7. Width WX14 in the X direction of each of the notches CT of the lead terminal 400a4 is less than the width WX12 in the X direction of each of the notches CT of the lead terminal 400a1 shown in FIG. 7. Therefore, the width WX124 of the lead terminal 400a4 in the X direction is less than the width WX120 in the X direction of the lead terminal 400a1 shown in FIG. 7. As described above, in the present modification, the width WX124 of the lead terminal 400a4 can be made small, for example, as compared with the above-described second embodiment. However, the width WX124 of the lead terminal 400a4 is preferably a width that does not make it difficult to connect the wires 500a to the lead terminal 400a4.

In the present modification, the side surface SDY of the lead terminal 400a4 close to the space SP is not exposed to the space SP. Therefore, in the present modification, for example, in the second step S200 of integrally forming the lead terminal 400a4 with the resin enclosure 300 by insert molding, it is possible to prevent the lead terminal 400a4 from being caught by a mold when the resin enclosure 300 is demolded.

As described above, the present modification can achieve effects similar to the effects by the above-described second embodiment.

B3: Third Modification

In any of the above-described embodiments and modifications, a semiconductor chip including an integrated circuit (for example, LVIC) different from the integrated circuit (for example, HVIC) provided in each of the control chips 200 may be disposed on the lead terminal 400a.

Figure 13:
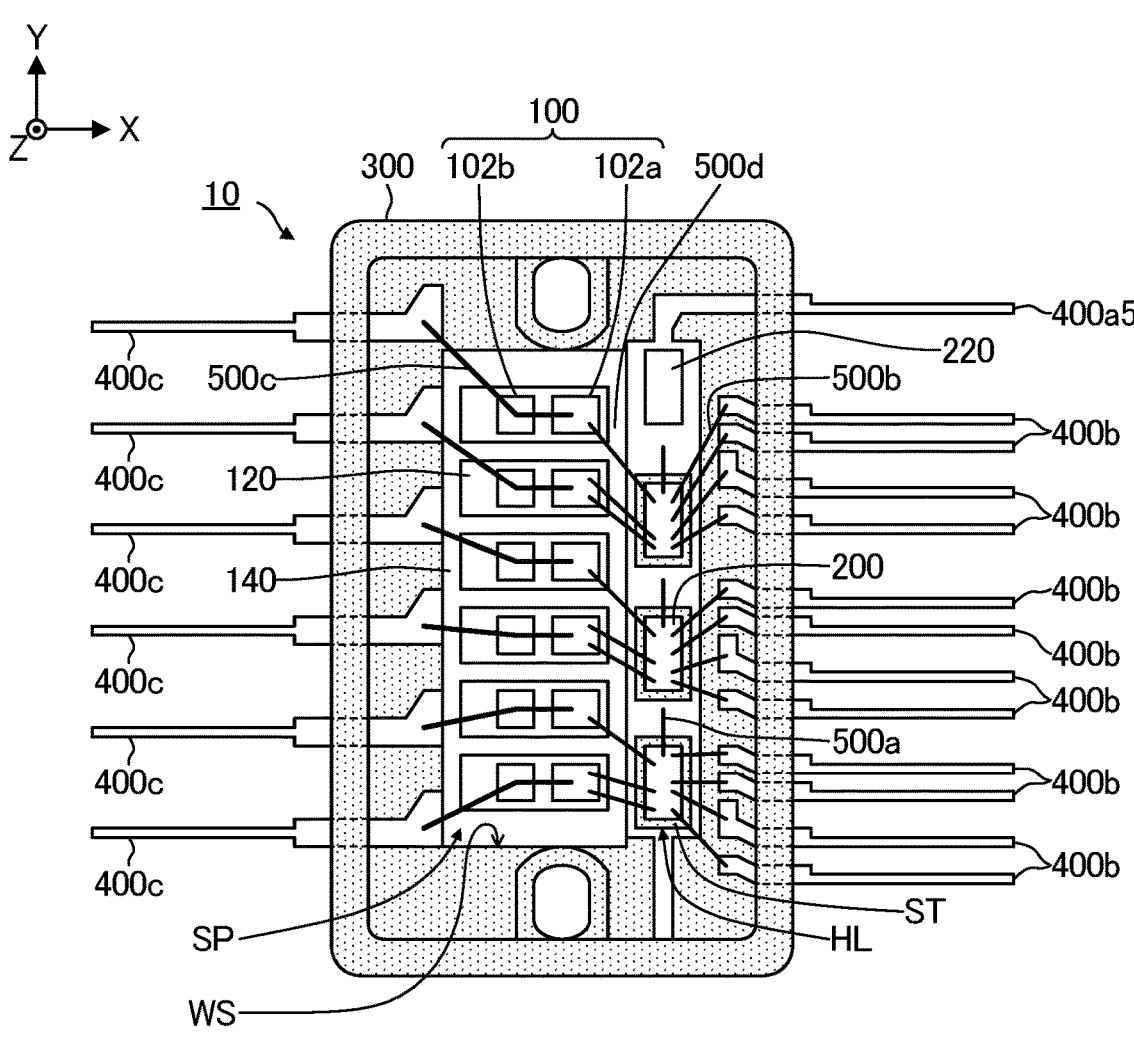
FIG. 13 shows an example of a semiconductor apparatus according to a third modification.

FIG. 13 shows an example of the semiconductor apparatus 10 according to a third modification. FIG. 13 is a plan view of the semiconductor apparatus 10 according to the third modification when viewed from the +Z direction. Elements similar to the elements described with reference to FIGS. 1 to 12 are denoted by similar reference numerals, and detailed description of the elements is omitted.

The semiconductor apparatus 10 shown in FIG. 13 is similar to the semiconductor apparatus 10 shown in FIG. 1 except in two aspects. One is that a lead terminal 400a5 is provided in place of the lead terminal 400a shown in FIG. 1. The other is that a control chip 220 is disposed on the lead terminal 400a5. In FIG. 13, the power semiconductor chips 102, the wires 500, the lead terminals 400, and other elements connected to the control chip 220 are omitted for clarity. In the following, differences between the semiconductor apparatus 10 shown in FIG. 13 and the semiconductor apparatus 10 shown in FIG. 1 are mainly described.

In the present modification, a case will be assumed that the integrated circuit provided in each of the control chips 200 is the HVIC, and an integrated circuit provided in the control chip 220 is the LVIC. The lead terminal 400a5 is similar to the lead terminal 400a shown in FIG. 1 except that the lead terminal 400a5 has an area at which the control chip 220 is disposed. For example, the control chip 220 is bonded to the lead terminal 400a5 with a conductive connection portion. In other words, the resin enclosure 300 (for example, pedestal portion ST) is not present between the control chip 220 and the lead terminal 400a5.

The control chip 220 may be bonded to the corresponding pedestal portion ST not overlapping with the lead terminal 400a5, as seen in planar view, with the adhesive 600, and it may be connected to the lead terminal 400a5 by the corresponding wire 500a, as with each of the control chips 200.

As described above, the present modification can achieve effects similar to the effects by each of the above-described embodiments and modifications.

B4: Fourth Modification

In the above-described second embodiment and second modification, a case in which the lead terminal 400a1 or 400a4 includes the notches CT is exemplified. However, the present disclosure is not limited to such an aspect. For example, in the lead terminal 400a4 shown in FIG. 12, the portion of the lead terminal 400a4 extending in the Y direction may not include the notches CT, and may be extend in the Y direction with the substantially constant width WX122 without including the notches CT. In this case, for example, as seen in planar view, the control chips 200 are arranged in a portion not overlapping with the lead terminal 400a4, between the inner wall surface WS (line with alternating long dash and two short dashes in FIG. 12) of the second frame portion FR2 and the lead terminal 400a4. As described above, the present modification can achieve effects similar to the effects by each of the above-described second embodiment and second modification.

DESCRIPTION OF REFERENCE SIGNS

10 . . . Semiconductor apparatus, 100 . . . Chip pair, 102 . . . Power semiconductor chip, 120 . . . Circuit layer, 130 . . . Connection portion, 140 . . . Insulated metal substrate, 142 . . . Metal substrate, 144 . . .

Insulation layer, 200 . . . Control chip, 300 . . . Resin enclosure, 400 . . . Lead terminal, 500 . . . Wire, 600 . . . Adhesive, 700 . . . Sealing resin, CT . . . Notch, FR1 . . . First frame portion, FR2 . . . Second frame portion, FR3 . . . Third frame portion, HL . . . Openings, LP1, LP2 . . . Wide-width portion, NP1, NP2 . . . Narrow-width portion, SP . . . Space, ST . . . Pedestal portion, TPa, TPa1, TPa2, TPb, TPc . . . Top surface, VL . . . Recess

What is claimed is:

1. A semiconductor apparatus comprising:
a first semiconductor chip;
a resin enclosure having a space in which the first semiconductor chip is positioned;
a lead terminal disposed in the resin enclosure;
a second semiconductor chip configured to:
    control the first semiconductor chip, and
    be disposed on a first portion of the resin enclosure, the first portion not overlapping with the lead terminal, as seen in planar view from a direction perpendicular to a top surface of the lead terminal, wherein the second semiconductor chip is bonded to the first portion, wherein a rear surface of the second semiconductor chip is bonded to the first portion with an insulating adhesive; and
a wire having a first end connected to the lead terminal and a second end connected to the second semiconductor chip.

2. The semiconductor apparatus according to claim 1, wherein the enclosure includes an inner wall surface defining the space, and
wherein the lead terminal and the second semiconductor chip are disposed on a surface intersecting an upper end of the inner wall surface.

3. The semiconductor apparatus according to claim 1, wherein the lead terminal having an opening, and
wherein the first portion of the resin enclosure is positioned inside the opening of the lead terminal.

4. The semiconductor apparatus according to claim 1, wherein the lead terminal includes a notch, and
wherein at least a part of the first portion of the resin enclosure is positioned inside the notch of the lead terminal.

5. The semiconductor apparatus according to claim 4, wherein an entirety of the second semiconductor chip is positioned inside the notch of the lead terminal, as seen in planar view.

6. The semiconductor apparatus according to claim 4, wherein the notch of the lead terminal opens toward the space, as seen in planar view.

7. The semiconductor apparatus recited in claim 1, further comprising a substrate having a circuit layer connected to the first semiconductor chip, wherein the circuit layer does not overlap either the lead terminal or the first portion in the planar view.

8. A semiconductor apparatus comprising:
a first semiconductor chip;
a resin enclosure having a space in which the first semiconductor chip is positioned;
a lead terminal disposed in the resin enclosure;
a second semiconductor chip configured to control the first semiconductor chip; and
a wire having a first end connected to the lead terminal and a second end connected to the second semiconductor chip, wherein the lead terminal includes a second top surface recessed from a first top surface to which the wire is connected, wherein the resin enclosure includes a first portion provided on the second top surface of the lead terminal, and wherein the second semiconductor chip is disposed in the first portion of the resin enclosure, so as to not be in contact with the lead terminal.

9. The semiconductor apparatus according to claim 8, wherein an entirety of the second semiconductor chip is positioned in the second top surface of the lead terminal, as seen in planar view from a direction perpendicular to the first top surface of the lead terminal.

* * * * *